United States Patent [19]

Wakata et al.

[11] Patent Number: 5,393,640
[45] Date of Patent: Feb. 28, 1995

[54] PEEL APART PHOTOSENSITIVE MATERIAL UTILIZING A BARRIER LAYER CONTAINING AN AROMATIC (METH)ACRYLATE CONTAINING COPOLYMER WITH A $T_g$ UNDER 70° C.

[75] Inventors: Yuichi Wakata; Chiyomi Niitsu, both of Shizuoka, Japan

[73] Assignee: Fuji Photo Film Co., Ltd., Kanagawa, Japan

[21] Appl. No.: 249,664

[22] Filed: May 26, 1994

Related U.S. Application Data

[63] Continuation of Ser. No. 973,651, Nov. 9, 1992, abandoned.

[30] Foreign Application Priority Data

Nov. 11, 1991 [JP] Japan .................................. 3-323765

[51] Int. Cl.⁶ .......................... G03F 7/105; G03F 7/11
[52] U.S. Cl. ...................... 430/262; 430/143; 430/166; 430/167; 430/259; 430/271; 430/293
[58] Field of Search ............... 430/143, 166, 167, 257, 430/259, 262, 271, 293

[56] References Cited

U.S. PATENT DOCUMENTS 4,797,343 1/1989 Nakamura ........................ 430/271
5,002,850 3/1991 Shinozaki et al. ................. 430/166

Primary Examiner—Janet C. Baxter
Assistant Examiner—Christopher G. Young
Attorney, Agent, or Firm—McAulay Fisher Nissen Goldberg & Kiel

[57] ABSTRACT

A photosensitive material either comprises a support, a peel layer, a barrier layer and a coloring material-containing photosensitive layer or a laminate of a coloring material layer and a photosensitive layer, superposed in order, or comprises a support having a releasing surface, an intermediate layer instead of both the peel layer and the barrier layer as mentioned above, a coloring material-containing photosensitive layer or a laminate of a coloring material layer and a photosensitive layer, superposed in order. The barrier layer or the intermediate layer comprises a polymer having a glass transition temperature not higher than 70° C. which is selected from the group consisting of a homopolymer of an acrylate monomer having an aromatic ring, a methacrylate monomer having an aromatic ring, an acrylamide monomer having an aromatic ring or a methacrylamide monomer having an aromatic ring, a copolymer of two or more of these monomers, and a copolymer of 50 molar % or more of one or more of these monomers and 50 molar % or less of one or two of other copolymerizable monomers.

7 Claims, 2 Drawing Sheets

PEEL APART PHOTOSENSITIVE MATERIAL UTILIZING A BARRIER LAYER CONTAINING AN AROMATIC (METH)ACRYLATE CONTAINING COPOLYMER WITH A $T_g$ UNDER 70° C.

This is a continuation of application Ser. No. 07/973,651, filed Nov. 9, 1992, now abandoned.

BACKGROUND OF THE INVENTION

1. Field of the Invention

The present invention relates to a photosensitive material advantageously employable for preparing a color proof or a display sheet.

2. Description of Prior Art

There are heretofore known various image transfer processes comprising a step of imagewise exposing a photosensitive transfer material comprising an undercoat layer of an organic polymer, a coloring material layer and a photosensitive layer provided on a temporary support to light; a step of developing it to form a color image on the undercoat layer; and a step of transferring the image to a permanent support using an adhesive (see, Japan Patent Publication Nos. 46(1971)-15326 and 49(1974)-441). These processes have advantages in that they can be used for preparing color proof in various procedures such as those of an overlay type and a surprint type. However, these processes have disadvantages in that an adhesive must be used in every transferring procedure and hence the processes are complicated and in that there is difficulty in keeping the accuracy of registration in transferring each color.

To eliminate the complicated procedures of the process, there have been proposed methods wherein after the formation of an image, the image is transferred to a permanent support under the application of heat and pressure (see, Japanese Patent Provisional Publication No. 47(1972)-41830, No. 48(1973)-9337 and No. 51(1976)-5101). Particularly, Japanese Patent Provisional Publication No. 51(1976)-5101 describes that an adhesive hot-melt polymer layer is provided on a permanent support and Japanese Patent Provisional Publication No. 47(1972)-41830 describes that an image is transferred directly to a permanent support such as an art paper sheet or a coated paper sheet.

However, these processes have still various disadvantage in that the final image is transferred to a permanent support in such a manner that the right and the left are reversed against the original image and in that when a hot-melt polymer is used as an adhesive, the melting point thereof is usually high and hence the transferring temperature must be high so that the dimensional stability of the support is lowered by the action of heat and the deviation of colors from one another in the registration procedure is caused when each color is transferred. When a hot-melt polymer having a low melting point is used as an adhesive, there are caused problems that after the formation of an image, sticking is observed, or the surface thereof is liable to be damaged.

As a method for eliminating the above-described disadvantages, there is proposed in Japanese Patent Provisional Publication No. 59(1984)-97140 a process wherein an image is transferred to a temporary image-receiving sheet before the image is transferred to a permanent support. This process includes steps of: preparing a temporary image-receiving sheet provided with an image receiving layer of a photopolymerizable material on a support; transferring an image of each color is transferred to the temporary image-receiving sheet; retransferring said image to a permanent support; and exposing a whole surface of it to light to cure the transferred photopolymerizable image receiving layer.

The above-described image transferring process using the temporary image-receiving sheet (hereinafter referred to simply as image-receiving sheet) is very effective in eliminating the aforementioned problems. In more detail, there are given the following advantages. An erect image of the masked original can be obtained on the permanent support. Since an ethylenically unsaturated polyfunctional monomer serving as a photopolymerizable substance is incorporated in the photopolymerizable image receiving layer of the image-receiving sheet, the photopolymerizable image-receiving sheet itself is soft, the transferring can be carried out at a low temperature, and after transferring, it can be exposed to light to cure. Thus, there are given advantages that after the transfer of the image, sticking is not observed and the final image has high resistance to damage.

As the photosensitive transfer material used in the image transferring method, there is generally used a photosensitive material comprising an undercoat layer of an organic polymer, and a coloring material-containing photosensitive layer (or a laminate composed of a coloring material layer and a photosensitive layer) in order in the form of a laminate. The undercoat layer not only functions as a peel layer but also gives an improvement of an image transferring property.

The undercoat layer is required to have the following properties: 1) showing an appropriate bonding strength to a temporary support and capable of being peeled from it; 2) showing nontackiness at room temperature and showing tackiness or fusibility depending on heating to keep transferring property; and 3) showing a barrier property that a coloring material contained in the a coloring material-containing photosensitive layer or a laminate of a coloring material layer and a photosensitive layer does not enter the undercoat layer when such layers are coated.

Lack of the barrier property causes the coloring material to enter the undercoat layer. If the coloring material is entered into the undercoat layer, the coloring material generates color fogging and hence brings about deterioration of quality of a resultant image. Further, in the case where a naphthoquinone diazide compound (the foot of the absorption spectrum of said compounds extends to reach the visible light region) is used as a photosensitive materials, color fogging is caused and the quality of the image lowers when the compounds are introduced into the undercoat layer.

In the formation of the coloring material-containing photosensitive layer or the coloring material layer as mentioned in 3) above, there is often used a coating solution containing an alcohol such as methanol, ethanol or propanol as a solvent. Hence, the undercoat layer is required to show barrier property against the solvent.

For example, Japanese Patent Provisional Publication No. 63(1988)-2037 discloses a photosensitive material using alcohol-soluble polymer (e.g., polyamide) as material of an undercoat layer. Accordingly, when the photosensitive material is used, occurrence of the color fogging and lowering of the quality of a image are not satisfactorily prevented owing to alcohol-soluble property of the polymer of the undercoat layer. Further, in the case that transferring is conducted using the photosensitive material particularly under the conditions of low temperature and low humidity, small bubbles are apt to enter into the formed image (e.g., a barrier layer or coloring material-containing photosensitive layer) so that quality of the final image often lowers.

To solve the above-problems, Japanese Patent Provisional Publication No. 63(1988)-2039 discloses a photosensitive material having a peel layer of an alcohol-soluble polymer, a barrier layer of an alcohol-insoluble polymer, and a coloring material-containing photosensitive layer (or a laminate composed of a coloring material layer and a photosensitive layer) in order in the form of a laminate. In the above photosensitive material, the peel layer and the barrier layer are used instead of the undercoat layer. Using the photosensitive material, the color fogging is not caused and the quality of an image does not lower under an ordinary environment.

However, in the case that transferring is conducted using the photosensitive material particularly under the conditions of low temperature and low humidity, small bubbles are apt to enter into the formed image (e.g., a barrier layer or coloring material-containing photosensitive layer) so that quality of the final image often lowers.

The inventors studied to solve the above problem and has discovered the following:

In the case that a polymer having high glass transition temperature is used as a polymer material of the peel layer, incorporation of bubbles into an image is decreased but registration in the transferring procedure becomes difficult. Further, in the case that a polymer having low glass transition temperature or a polymer containing plasticizer is used as a polymer material of the barrier layer, extent of mixing of the barrier layer with other layer or extent of color fogging increases, or uniformity of a surface of the barrier layer lowers. On the other hand, increase of thicknesses of these layers decreases incorporation of bubbles. However, increase of light scattering by the thick layers deteriorates quality of the final image. Thus, there is desired a photosensitive material in which a resultant image have a high quality, transferring property is excellent even under the conditions of low temperature and low humidity and color fogging is little.

SUMMARY OF THE INVENTION

It is an object of the present invention to provide a photosensitive material which is favorably employable for obtaining an image of good quality.

It is another object of the invention to provide a photosensitive material particularly suitable for use as a photosensitive material which is favorably employable for obtaining a final image of good quality and has favorable transferring property even under the conditions of low temperature and low humidity.

There is provided by the present invention a photosensitive material comprising a support, a peel layer, a barrier layer and a coloring material-containing photosensitive layer or a laminate of a coloring material layer and a photosensitive layer, superposed in order;

wherein said barrier layer comprises a polymer having a glass transition temperature not higher than 70° C. which is selected from the group consisting of a homopolymer of an acrylate monomer having an aromatic ring, a methacrylate monomer having an aromatic ring, an acrylamide monomer having an aromatic ring or a methacrylamide monomer having an aromatic ring, a copolymer of two or more of these monomers, and a copolymer of 50 molar % or more of one or more of these monomers and 50 molar % or less of one or two of other copolymerizable monomers.

There is also provided by the present invention a photosensitive material comprising a support, a intermediate layer and a coloring material-containing photosensitive layer or a laminate of a coloring material layer and a photosensitive layer, superposed in order;

wherein a surface of said support on which said intermediate layer is to be provided has a releasing property and said intermediate layer comprises a polymer having a glass transition temperature not higher than 70° C. which is selected from the group consisting of a homopolymer of an acrylate monomer having an aromatic ring, a methacrylate monomer having an aromatic ring, an acrylamide monomer having an aromatic ring or a methacrylamide monomer having an aromatic ring, a copolymer of two or more of these monomers, and a copolymer of 50 molar % or more of one or more of these monomers and 50 molar % or less of one or two of other copolymerizable monomers.

The preferred embodiments of the present invention are as follows:

1) The photosensitive material wherein said peel layer is an alcohol-soluble layer and said barrier layer is alcohol-insoluble layer.

2) The photosensitive material wherein said polymer has a weight-average molecular weight in the range of 10,000 to 3,000,000.

3) The photosensitive material wherein said polymer is selected from the group consisting of a homopolymer of an acrylate monomer having an aromatic ring or a methacrylate monomer having an aromatic ring, a copolymer of two or more of these monomers, and a copolymer of 50 molar % or more of one or more of these monomers and 50 molar % or less of one or two of other copolymerizable monomers.

4) The image forming process wherein said surface having a releasing property comprises a layer containing at least one selected from the group consisting of a silicon compound, a silicone, a fluoro-compound, a fluoro-resin, polyolefin, an ethylene/ethyl acrylate copolymer, an ethylene/vinyl acetate copolymer and an ionomer resin.

The photosensitive material of the invention is excellent in transferring property even under the conditions of low temperature and low humidity particularly and easily gives a final image of good quality without color fogging. Accordingly, the photosensitive material of the invention is useful for preparation of color proof in color proofing or production of display.

DETAILED DESCRIPTION OF THE INVENTION

The photosensitive material of the invention has a structure (a) comprising a support, a peel layer, a barrier layer and a coloring material-containing photosensitive layer or a laminate of a coloring material layer and a photosensitive layer, or a structure (b) comprising a support provided having a releasing surface, an intermediate layer and a coloring material-containing photosensitive layer or a laminate of a coloring material-containing layer and a photosensitive layer.

The structure of the photosensitive material of the invention is explained referring to attached drawings.

Figure 1:
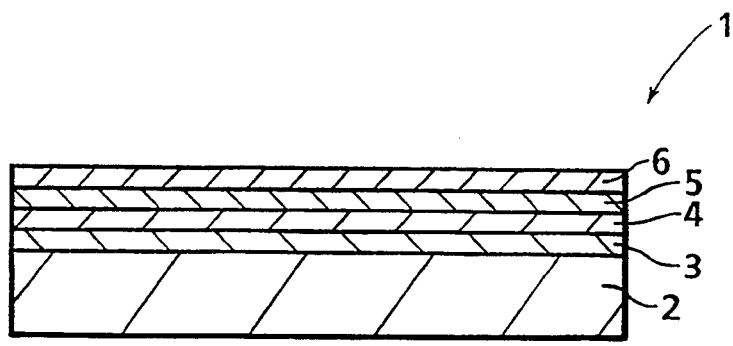
FIG. 1 is a section view schematically showing an example of the photosensitive material of the invention.
Figure 2:
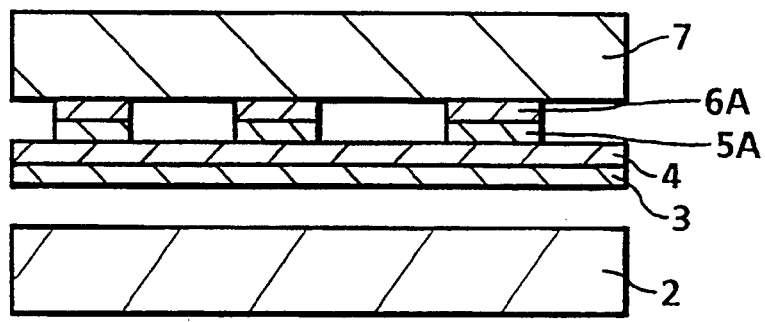
FIG. 2 shows the condition in which the photosensitive material of FIG. 1 sticking to a temporary image-receiving sheet for transferring is peeled.

FIG. 1 is a section view schematically showing an example of the photosensitive material of the structure (a) of the invention. A photosensitive material 1 comprises a support 2, a peel layer 3 provided on the support, a barrier layer 4 provided on the peel layer, a coloring material-containing layer 5 provided on the barrier layer and a photosensitive layer 6 provided on the coloring material-containing layer. In the case that the photosensitive material imagewise exposed to a light is transferred to a temporary image-receiving sheet, the material is peeled between the support and the peel layer to separate into the support and a laminate of the peel layer, the barrier layer, the coloring material layer, the photosensitive layer and the temporary image-receiving sheet. FIG. 2 shows the condition in which the above photosensitive material sticking to a temporary image-receiving sheet for transferring is peeled. One side peeled is composed only of the support 2, and the other side is a laminate composed of the peel layer 3, the barrier layer 4, the coloring material-containing layer (portion of image) 5A, the photosensitive layer (portion of image) 6A and the temporary image-receiving sheet 7.

Hence, the peel layer has a property that its bonding strength to the support is less than that to the barrier layer and that between the other layers (and temporary image-receiving sheet). In preparation of color proof, the laminate having the peel layer is used as a temporary image-receiving sheet for next color so that the peel layer is required to have a property which is apt to stick to a photosensitive layer.

Figure 3:
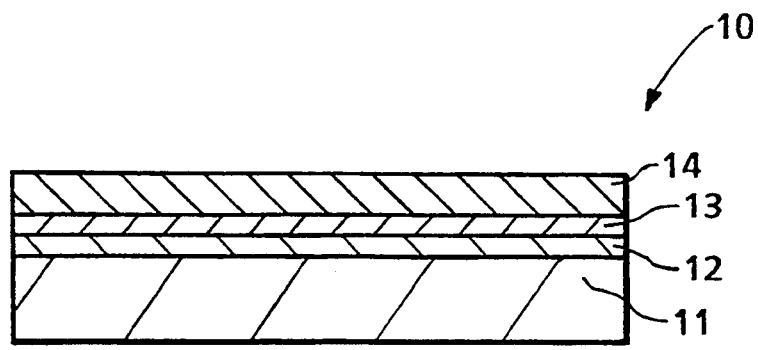
FIG. 3 is a section view schematically showing another example of the photosensitive material of the invention.

FIG. 3 is a section view schematically showing another example of the photosensitive material of the structure (a) of the invention. A photosensitive material 10 comprises a support 11, a peel layer 12 provided on the support, a barrier layer 13 provided on the peel layer, and a coloring material-containing photosensitive layer 14 provided on the barrier layer. Similarly, the photosensitive material sticked to a temporary image-receiving sheet is peeled between the support and the peel layer.

Figure 4:
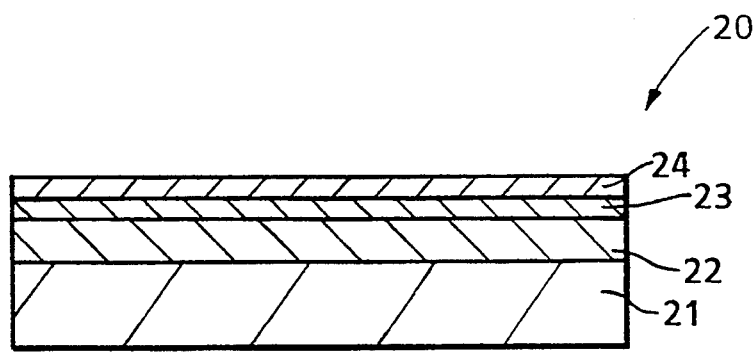
FIG. 4 is a section view schematically showing an example of the photosensitive material of the invention using a support having a releasing surface.
Figure 5:
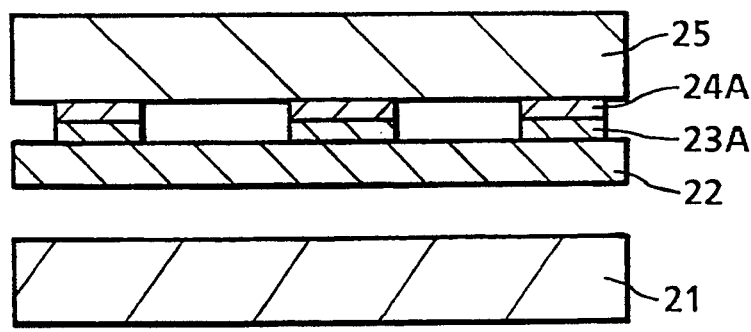
FIG. 5 shows the condition in which the photosensitive material of FIG. 4 sticking to a temporary image-receiving sheet for transferring is peeled.

FIG. 4 is a section view schematically showing an example of the photosensitive material of the structure (b) of the invention. A photosensitive material 20 comprises a a support 21 having a releasing surface, an intermediate layer 22 provided on the releasing surface of the support, a coloring material-containing layer 23 provided on the an intermediate layer and a photosensitive layer 24 provided on the coloring material-containing layer. In the case that the photosensitive material imagewise exposed to light is transferred to a temporary image-receiving sheet, the material is peeled between the intermediate layer and the releasing surface of the support to separate into the support and a laminate of the intermediate layer, the coloring-containing material layer, the photosensitive layer and the temporary image-receiving sheet. FIG. 5 shows the condition in which the above photosensitive material sticking to a temporary image-receiving sheet for transferring is peeled. One side is composed only of the support 21 (having a releasing surface), and the other side is a laminate composed of the intermediate layer 22, the coloring material-containing layer (portion of image) 23A, the photosensitive layer (portion of image) 24A and the temporary image-receiving sheet 25.

Figure 6:
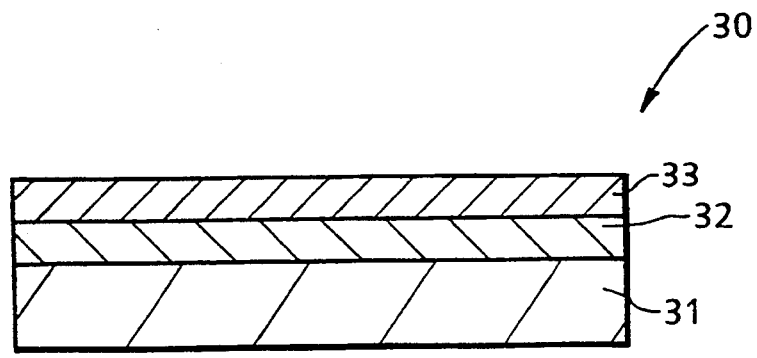
FIG. 6 is a section view schematically showing another example of the photosensitive material of the invention using a support having a releasing surface.

FIG. 6 is a section view schematically showing another example of the photosensitive material of the structure (b) of the invention. A photosensitive material 30 comprises a support 31 having a releasing surface, an intermediate layer 32 provided on the peeling treated surface of the support, and a coloring material-containing photosensitive layer 33 provided on the intermediate layer. Similarly, the photosensitive material sticked to a temporary image-receiving sheet for transferring is peeled between the support and the intermediate layer.

The photosensitive materials having the structure (a) shown in FIGS. 1 and 3 have the peel layer which is formed on the support. Hence, the photosensitive material can be given a desired peelable property by varying peelable property of the peel layer. On the other hand, the photosensitive materials having the structure (2) shown in FIGS. 4 and 6 have the support of which surface is so treated as to easily peel (at room temperature) from the intermediate layer. In more detail, the photosensitive materials have no peel layer so that the materials are easily prepared.

The photosensitive material having the structure (a) of the invention can be prepared according to the process described below.

The support of the photosensitive material of the invention serves as a temporary support (while a final image is formed on a permanent support) in an image forming method utilizing the photosensitive material of the invention. The material of the support preferably has an excellent flexibility, and preferably has a transmission property for ultraviolet rays and a property which is not apt to cause remarkable deformation or elongation even under application of pressure or heating.

Examples of materials of the support include polyester films such as a polyethylene terephthalate (PET) film, a polycarbonate film, a polystyrene film, cellulose derivative films such as a cellulose triacetate film, polyolefin films such as a polyethylene film and a polypropylene film, and a polyvinyl chloride film. Preferred is biaxially oriented polyethylene terephthalate film. The thickness of the support is preferred in the range of 20 to 150 μm.

On the support, a peel layer is provided.

In the preparation of the photosensitive material of the invention, a coloring material-containing photosensitive layer or a laminate of a coloring material layer and a photosensitive layer is formed by coating on a barrier layer a coating solution thereof which is prepared using a solvent such as methanol, ethanol or propanol. Hence, the barrier layer preferably has an alcohol-insoluble property. Further, to easily peel the photosensitive material (i.e., a laminate composed of the peel layer, the barrier layer, the coloring material-containing photosensitive layer or the laminate of the coloring material layer and the photosensitive layer, and a temporary image-receiving sheet) from the support, the peel layer has preferably an alcohol-soluble property.

The peel layer of the invention is preferred to be an alcohol-soluble layer. To render the peel layer alcohol-soluble, it is preferred that the peel layer contains an alcohol-soluble polymer, particularly alcohol-soluble polyamide. For example, the peel layer of an alcohol-soluble polymer is described in Japanese Patent Publication No. 60-29162.

As examples of the alcohol-soluble polyamide, there can be mentioned linear polyamides synthesized from a dibasic fatty acid and an amine such as a diamine, $\omega$-amino acid, a lactam or a derivative thereof. The linear polyamide may be any of homopolymers, random copolymers and block copolymers. There may be used polyamides having a substituent or substituents attached to carbon or nitrogen atoms of the principal chain and polyamides having other linkages in addition to C—C linkages and C—N linkages of the main chain.

Typical examples of the alcohol-soluble polyamides include linear homopolyamides such as nylons 3, 4, 5, 6, 11, 12, 13, 66, 610 and 1313, a polymer of m-xylylenediamine and adipic acid, a polymer of trimethylhexamethylenediamine and terephthalic acid and a polymer of 1,4-diaminomethylcyclohexane and suberic acid; interpolyamides such as types of 6/66/610, 6/66/610/612 and 6/66/12, and $\epsilon$-caprolactam/adipic acid/hexamethylenediamine/4,4-diaminodicyclohexylmethane co-polyamide; and polyamide derivatives such as N-methylol-substituted polyamide, N-alkoxyalkyl-substituted polyamide and N-aryloxyalkyl-substituted polyamide.

The peel layer may contain other high-molecular polymer or additives in addition to the alcohol-soluble polyamide. However, it is desirable that the peel layer contains at least 50% by weight of the alcohol-soluble polyamide in order to allow the peel layer to have a peeling function. The peel layer is formed by coating a coating solution prepared through dissolving the above materials in appropriate solvents such as alcohols on the support and drying the coated layer. A thickness of the peel layer is preferred to be in the range of 0.2 to 10 $\mu$m.

The barrier layer of the invention is generally formed on the peel layer. The barrier layer comprises a polymer having a glass transition point not higher than 70° C. which is selected from the group consisting of a homopolymer of an acrylate monomer having an aromatic ring, a methacrylate monomer having an aromatic ring, an acrylamide monomer having an aromatic ring or a methacrylamide monomer having an aromatic ring, a copolymer of two or more of these monomers, and a copolymer of 50 molar % or more of one or more of these monomers and 50 molar % or less of one or two of other copolymerizable monomers.

In more detail, the above polymer is synthesized by ploymerizing one or two or more of acrylate monomer or methacrylate monomer having at least one aromatic ring and at least one unsaturated bond (hereinafter referred to as "(meth)acrylate having an aromatic ring"), or an acrylamide monomer or methacrylamide monomer having at least one aromatic ring and at least one unsaturated bond (hereinafter referred to as "(meth)acrylamide having an aromatic ring"); or a mixture of one or two or more of these monomers and one or two or more of monomers having at least one unsaturated bond copolymerizable with the monomers, in the presence of a known polymerization initiator and an appropriate solvent if desired using a known polymerization method.

Examples of (meth)acrylate monomers having an aromatic ring include phenyl (meth)acrylate, benzyl (meth)acrylate, methoxybenzyl (meth)acrylate, chlorobenzyl (meth)acrylate, phenoxyethyl (meth)acrylate, 2-hydroxy-3-phenoxypropyl (meth)acrylate, cresyl (meth)acrylate and naphthyl (meth)acrylate. Examples of (meth)acrylamide monomers having an aromatic ring include aryl (meth)acrylamide (examples of aryl group include phenyl, tolyl, nitrophenyl, naphthyl and hydroxyphenyl), N,N-diaryl(meth)acrylamide (examples of aryl group include phenyl), N-methyl-N-phenyl(meth)acrylamide, N-(phenylsulfonyl)(meth)acrylamide, N-(p-methylphenylsulfonyl) (meth)acrylamide and N-benzyl (meth)acrylamide.

Examples of the monomers having at least one unsaturated bond (hereinafter referred to as other copolymerizable monomer) copolymerizable with the (meth)acrylate monomer or (meth)acrylamide monomer having an aromatic ring, include (meth)acrylic acid esters having no aromatic ring, (meth)acrylamides having no aromatic ring, allyl compounds, vinyl ethers, vinyl esters, crotonic acid esters, itaconic acid esters, maleic acid or fumaric acid esters, styrenes, acrylonitrile and methacrylonitrile.

Examples of (meth)acrylic acid esters having no aromatic ring include methyl (meth)acrylate, ethyl (meth)acrylate, propyl (meth)acrylate, isopropyl (meth)acrylate, butyl (meth)acrylate, amyl (meth)acrylate, hexyl (meth)acrylate, cyclohexyl (meth)acrylate, ethylhexyl (meth)acrylate, octyl (meth)acrylate, t-octyl (meth)acrylate, chloroethyl (meth)acrylate, allyl (meth)acrylate, 2-hydroxyethyl (meth)acrylate, 2-hydroxypropyl (meth)acrylate, 4-hydroxybutyl (meth)acrylate, 2,2-dimethyl-3-hydroxypropyl (meth)acrylate, 5-hydroxypentyl (meth)acrylate, trimethylolpropane mono(meth)acrylate, pentaerythritol mono(meth)acrylate, furfuryl (meth)acrylate and tetrahydrofurfuryl (meth)acrylate.

Examples of (meth)acrylamides having no aromatic ring include (meth)acrylamide, N-alkyl(meth)acrylamides (examples of alkyl group include methyl, ethyl, propyl, butyl, t-butyl, hexyl, octyl, ethylhexyl, cyclohexyl and hydroxyethyl), N,N-dialkyl(meth)acrylamides (examples of alkyl group include methyl, ethyl, propyl, butyl, isobutyl, ethylhexyl and cyclohexyl), N-hydroxyethyl-N-methyl(meth)acrylamide and N-2-acetoamideethyl-N-acetyl(meth)acrylamide.

Examples of the allyl compounds include allyl esters (e.g., allyl acetate, allyl caprolate, allyl caprylate, allyl laurate, allyl palmitate, allyl stearate, allyl acetoacetate, allyl lactate and allyl benzoate) and allyl oxyethanol.

Examples of vinyl ethers include alkyl vinyl ethers (examples of alkyl group include hexyl, octyl, decyl, ethylhexyl, methoxyethyl, ethoxyethyl, chloroethyl, 1-methyl-2,2-dimetylpropyl, 2-ethylbutyl, hydroxyethyl, hydroxyethoxyethyl, dimethylaminoethyl, diethylaminoethyl, butylaminoethyl and tetrahydrofurfuryl), vinyl aryl ethers (examples of aryl group include phenyl, tollyl, chlorophenyl, 2,4-dichlorophenyl, naphtyl and anthranyl) and benzyl vinyl ethers.

Examples of vinyl esters include vinyl acetate, vinyl butylate, vinyl isobutylate, vinyl trimethylacetate, vinyl diethylacetate, vinyl valerate, vinyl caproate, vinyl chloroacetate, vinyl dichloroacetate, vinyl methoxyacetate, vinyl butoxyacetate, vinyl acetoacetate, vinyl lactate, vinyl cyclohexylcarboxylate, vinylphenyl acetate, vinyl-β-phenyl butylate, vinyl benzoate, vinyl salicylate, vinyl chlorobenzoate, vinyl tetrachlorobenzoate and vinyl naphthonate.

Examples of crotonic acid esters include alkyl crotonates (e.g., butyl crotonate, hexyl crotonate and glycerin monocrotonate).

Examples of itaconic acid esters include itaconic acid dialkyl esters such as dimethyl itaconate, diethyl itaconate and dibutyl itaconate.

Examples of maleic acid or fumaric acid esters include dimethyl maleate and dibutyl fumalate.

Examples of styrenes include styrene, alkylstyrene (e.g., methylstyrene, dimethylstyrene, trimethylstyrene, ethylstyrene, diethylstyrene, isopropylstyrene, butylstyrene, hexylstyrene, cyclohexylstyrene, decylstyrene, benzylstyrene, chloromethylstyrene, trifluoromethylstyrene, ethoxymethylstyrene and acetoxymethylstyrene), alkoxystyrene (e.g., methoxystyrene, 4-methoxy-3-methylstyrene and dimethoxystyrene), halogenostyrene (e.g., chlorostyrene, dichlorostyrene, trichlorostyrene, tetrachlorostyrene, pentachlorostyrene, bromostyrene, dibromostyrene, iodostyrene, fluorostyrene, trifluorostyrene, 2-bromo-4-trifluoromethylstyrene and 4-fluoro-3-trifluoromethylstyrene).

The glass transition temperature of the polymer employed for the barrier layer is adjusted to not higher than 70° C. by an appropriate combination of these monomers. In the case that a glass transition temperature of a used polymer is at than 70° C., a photosensitive material using the polymer lowers in transferring property at low temperature and humidity.

As preferred examples of the above polymer contained in the barrier layer of the photosensitive material according to the invention, there can be mentioned benzyl acrylate/methyl methacrylate copolymer, benzyl methacrylate/ethyl acrylate copolymer and benzyl acrylate/benzyl methacrylate copolymer.

The ratio of an (meth)acrylate monomer(s) having an aromatic ring or an (meth)acrylamide monomer(s) having an aromatic ring and a monomer(s) copolymerizable with the monomers is preferred in the range of 100:0 to 10:90 ((meth)acrylate monomer(s) or (meth)acrylamide monomer(s) having an aromatic ring: monomer(s) copolymerizable with the monomers) by mole, particularly in the range of 100:0 to 20:80. A weight-average molecular weight of the above polymer is preferred in the range of 10,000 to 3,000,000, particularly in the range of 30,000 to 2,000,000. In the case that the molecular weight is less than 10,000, the polymer lowers in film-forming properties to little function as a barrier layer. In the case that the molecular weight is larger than 3,000,000, the polymer is spairingly dissolved in any solvent not to substantially form a layer by coating.

The barrier layer may contain the above polymer of only one kind, or may contain the polymer of two or more kinds. Polymers other than the above polymer may be contained in the barrier layer so long as less than 50 weight % based on a total amount of polymers in the barrier layer. The barrier layer may contain various additives such as a material for giving adhesiveness and a plsticizer so long as color fogging is not increased. The barrier layer may have a structure consisting of two or more layers.

The barrier layer is formed by coating a coating solution prepared through dissolving the above materials in an appropriate solvent on the peel layer of the support and drying the coated layer. The coating solution may contain various additives. A thickness of the barrier layer is generally in the range of 0.1 to 10 μm, preferably in the range of 0.2 to 10 μm and more preferably in the range of 0.3 to 5 μm.

The coloring material-containing photosensitive layer or the laminate of the coloring material layer and the photosensitive layer to be provided on the barrier layer will be described hereinbelow. The coloring material-containing photosensitive layer is basically a layer comprising a coloring material such as pigment or dye dispersed or uniformly dissolved in a photosensitive resin composition. The coloring material-containing layer is basically a layer comprising a coloring material such as pigment or dye dispersed or uniformly dissolved in a polymer. The photosensitive layer is basically a layer comprising a photosensitive resin composition. The laminate of the coloring material layer and the photosensitive layer has the same functions as the coloring material-containing photosensitive layer.

The coloring materials which can be used in the present invention are described in the aforementioned patent publications. Appropriate coloring materials can be chosen from those described in these publications. Examples of the coloring materials include pigments and dyes described in Japanese Patent Provisional Publications No. 47(1972)-16124, No. 52(1977)-89916, No. 55(1980)-117142 and No. 55(1980)-127552, U.S. Pat. No. 4,472,494 and Color index. Particularly, when the photosensitive material is used as color proof for print, pigments are preferably used so as to allow color reproducibility to agree with the desired print.

As the coloring materials for color filter, pigments of red, green, blue or black are generally employed. Preferred examples include Carmine 6B (C.I. 12490), Phthalocyanine green (C.I. 74260), Phthalocyanine blue (C.I. 74160) and Mitsubishi carbon black MA-100.

As the coloring materials for display, pigments or dyes of yellow, magenta, cyan or black are generally employed, further metallic powders, white pigments and fluorescent materials are also employed. Preferred examples of the pigments include Lionol yellow #1201 (C.I. 21090), Lionol yellow GRO (C.I. 21090), Shimura fast yellow 8GF (C.I. 21105), Benzidine yellow 4T-564D (C.I. 21095), Shimura fast red 4015 (C.I. 12355), Lionol red 7B4401 (C.I. 15850), Fastogen Blue TGR-L (C.I. 74160), Lionol blue SM (C.I. 26150), Mitsubishi carbon black MA-100 and Mitsubishi carbon black #40. Preferred examples of the dyes include Victoria pure blue (C.I. 42595), Auramine O (C.I. 41000), Cathilon brilliant flavin (C.I. basic 13), Rhodamine 6GCP (C.I. 45160), Rhodamine B (C.I. 45170), Safranine OK 70:100 (C.I. 50240), Erioglaucine X (C.I. 42080) and Fast black HB (C.I. 26150).

These pigments or dyes (coloring materials) may be used either alone or as a mixture of two or more of them. The coloring material is preferably contained in the coloring material-containing layer in the range of 1 to 60 weight % based on the weight of the total solid of the layer, more preferably in the range of 5 to 50 weight %.

Polymers which can be used to disperse or dissolve the coloring material therein, are disclosed in the aforementioned patent publications. An appropriate polymer can be chosen from those described therein. Particularly, alkali-soluble or alkali-swelling polymers are preferred, because the coloring material layer and the photosensitive layer containing naphthoquinone diazide photosensitive material can be develop in a single bath.

Examples of the above polymers include copolymers of methacrylic acid (i.e., copolymer of methacrylic acid and monomer polymerizable with methacrylic acid), copolymers of acrylic acid, copolymers of itaconic acid, copolymers of crotonic acid, copolymers of maleic acid, partial-esterificated copolymers containing maleic acid and cellulose derivatives having a side chain having a carboxyl group. Further, phenol resin, rosin and polyhydroxystyrene can be also employed. The molecular weight of the polymer is preferably in the range of 10,000 to 1,000,000, more preferably in the range of 20,000 to 400,000.

The polymers are preferably contained in the coloring material-containing layer in the range of 40 to 95 weight % based on the weight of the total solid of the layer, more preferably in the range of 50 to 95 weight %. Additives such as a plasticizer, stabilizer for dispersing pigment and surface-active agent may be incorporated into the coloring material layer, if desired.

The coloring material-containing layer is formed by coating a coating solution prepared through dissolving the above materials in an appropriate solvent on the barrier layer and drying the coated layer. The coating solution may contain various additives. A thickness of the coloring material-containing layer is preferred to be in the range of 0.1 to 10 μm.

The photosensitive layer to be provided on the coloring material-containing layer will be described hereinbelow. Examples of the photosensitive resin composition constituting the photosensitive layer include one comprising a photosensitive ingredient and a polymer or one comprising a photosensitive polymer. As the photosensitive ingredient, P→P (positive to positive) type photosensitive resin composition (i.e., resin for forming a positive working photosensitive layer) such as a composition containing a quinoneazide type photosensitive agent such as o-quinonediazide, and N→P (negative to positive) type photosensitive resin composition (i.e., resin for forming a negative working photosensitive resin layer) such as a composition comprising a polymerizable unsaturated monomers and a photopolymerization initiator or diazonium salt compounds.

Preferred examples of the quinoneazide type photosensitive agent include a photosensitive esterification product of o-quinonediazide. The quinoneazide type photosensitive agent may be other compounds than the photosensitive esterification product of o-quinonediazide. The quinoneazide type photosensitive agents may be either alone or as a mixture of two or more kinds. The quinoneazide type photosensitive agents are preferably contained in the photosensitive layer in the range of 10 to 50 weight % based on the weight of the total solid of the layer, more preferably in the range of 15 to 40 weight %.

Examples of the polymerizable monomers include monomer compounds having a boiling point of 100° C. or higher under atmospheric pressure and at least one ethylenical unsaturated group. Examples of such monomers include monofunctional acrylates or methacrylates such as polyethylene glycol mono(meth)acrylate, polypropylene glycol mono(meth)acrylate and phenoxyethyl (meth)acrylate; polyfunctional acrylates or methacrylates of polyols such as polyethylene glycol di(meth)acrylate, polypropylene glycol di(meth)acrylate, trimethylolethane tri(meth)acrylate, trimethylolpropane tri(meth)acrylate, trimethylolpropane di(meth)acrylate, neopenthyl glycol di(meth)acrylate, pentaerythritol tetra(meth)acrylate, pentaerythritol tri(meth)acrylate, dipentaerythritol hexa(meth)acrylate, dipentaerythritol penta(meth)acrylate, hexanediol di(meth)acrylate, trimethylolpropane ((meth)acryloyloxypropyl) ether, tri((meth)acryloyloxyethyl) isocyanurate, tri((meth)acryloyloxyethyl) cyanurate and glycerol tri(meth)acrylate; urethane (meth)acrylates described in Japanese Patent Publications No. 48(1973)-41708 and No. 50(1975)-6034 and Japanese Patent Provisional Publications No. 51(1976)-37193; polyester (meth)acrylates described in Japanese Patent Provisional Publications No. 48(1973)-64183 and Japanese Patent Publications No. 49(1974)-43191 and No. 52(1977)-30490; and epoxy (meth)acrylates of reaction product of epoxy resin and (meth)acrylic acid.

The polymerizable monomers may be either alone or as a mixture of two or more kinds. The polymerizable monomers are preferably contained in the photosensitive layer in the range of 5 to 50 weight % based on the weight of the total solid of the layer, more preferably in the range of 10 to 40 weight %. In the case that the polymerizable monomers are contained in less than 5 weight %, photosensitivity of the layer or strength of the resultant image lowers. In the case that the polymerizable monomers are contained in more than 50 weight %, adhesion of the layer is so increased as not to be preferable.

The above photopolymerizable monomers are usually used together with a photopolymerization initiator which is activated by actinic rays. Optionally, a heat polymerization inhibitor is added.

Examples of the photopolymerization initiators include vic-polyketaldonyl compounds disclosed in U.S. Pat. No. 2,367,660, aciloin ether compounds disclosed in U.S. Pat. No. 2,448,828, aromatic aciloin compounds replaced with α-hydrocarbon disclosed in U.S. Pat. No. 2,722,512, multi-ring quinone compounds disclosed in U.S. Pat. No. 3,046,127 and No. 2,951,758, a combination of triarylimidazole dimer and p-aminoketone disclosed in U.S. Pat. No. 3,549,367, benzothiazole compounds and trihalomethyl-s-triazine compounds described in Japanese Patent Publications No. 51(1976)-48516, trihalomethyl-s-triazine compounds described in U.S. Pat. No. 4,239,850 and trihalomethyloxadiazole compounds described in U.S. Pat. No. 4,212,976.

The photopolymerization initiators may be either alone or as a mixture of two or more kinds of them. The photopolymerization initiators are preferably contained in the photosensitive layer in the range of 0.5 to 20 weight % based on the weight of the total solid of the layer, more preferably in the range of 2 to 15 weight %. In the case that the initiators are contained in less than 0.5 weight %, photosensitivity of the layer or strength of the resultant image is low. Even if the initiators are contained in more than 20 weight %, improvement of these properties is not observed.

Examples of the above-mentioned diazoniume salt compounds include diazoniume salts described in U.S. Pat. Nos. 3,867,147 and 2,632,703. Particularly, diazo resin that is a condensation product derived from an aromatic diazonium salt compound and a compound containing an active carbonyl group (e.g., formaldehyde), is useful. Further, there can be mentioned compounds described in Japanese Patent Provisional Publications No. 58(1983)-27141.

The diazoniume salt compounds may be either alone or as a mixture of two or more kinds of them. The diazoniume salt compounds are preferably contained in the photosensitive layer in the range of 1.0 to 50 weight % based on the weight of the total solid of the layer, more preferably in the range of 3 to 20 weight %.

Examples of the polymers employable together with the photosensitive ingredient (i.e., photopolymerization monomers, photopolymerization initiators, etc.), include the same polymers as those used in the coloring material-containing layer. Further, there can be used novolac resin. Examples of the novolac resin include those described in U.S. Pat. No. 3,184,310 and No. 3,535,157, Japanese Patent Publication Nos. 50(1975)-7482, 50(1975)-8658 and No. 51(1976)-14042, and Japanese Patent Provisional Publications No. 49(1974)-48403. The novolac resin can be also employed in a combination of other polymers.

The polymers may be either alone or as a mixture of two or more kinds. The polymers are preferably contained in the photosensitive layer in the range of 40 to 95 weight % based on the weight of the total solid of the layer, more preferably in the range of 50 to 90 weight %. In the case that the polymers are contained in less than 40 weight %, adhesion of the layer is so high. In the case that the polymers are contained in more than 95 weight %, photosensitivity of the layer or strength of the resultant image lowers.

As the photosensitive resin composition constituting the photosensitive layer, a photosensitive polymer can be employed as previously described. Examples of the photosensitive polymer further include polymers that photosensitive groups such as a cinnamoyl group and a maleimide group are introduced to the above polymers. As examples of such polymers, there can be mentioned a polymer having a cinnamoyl group derived from polyvinylalcohol and polymers described in Japanese Patent Provisional Publications No. 2(1990)-157762, U.K. Patent No. 1,112,277, No. 1,313,390, No. 1,341,004 and No. 1,377,747.

As a binder employed together with a compound having an azide group as a photosensitive group, there can be mentioned polyacrylamide, polyacrylonitrile, alcohol-soluble nylon (polyamide), rubbers, styrene/-butadiene copolymers and phenol resins.

The photosensitive layer is formed by coating a coating solution prepared through dissolving the above materials in an appropriate solvent on the coloring material-containing layer and drying the coated layer. The coating solution may contain various additives. A thickness of the photosensitive layer is preferred to be in the range of 0.1 to 10 μm.

The coloring material-containing photosensitive layer may be provided on the barrier layer, instead of the laminate of the coloring material layer and the photosensitive layer. The structure of and material for the coloring material-containing photosensitive layer are known. The coloring material-containing photosensitive layer can be formed by referring to known techniques. The coloring material-containing photosensitive layer is basically a layer comprising the above-mentioned coloring materials dispersed or uniformly dissolved in the above-mentioned photosensitive resin composition. For example, the coloring material-containing layer and the photosensitive layer are combined together to form the single coloring material-containing photosensitive layer.

The coloring materials are preferably contained in the coloring material-containing photosensitive layer in the range of 1 to 30 weight % based on the weight of the total solid of the layer, more preferably in the range of 5 to 20 weight %.

The coloring material-containing photosensitive layer is formed by coating on the barrier layer a coating solution prepared through dissolving the above materials in an appropriate solvent and drying the coated layer. The coating solution may contain various additives. A thickness of the coloring material-containing photosensitive layer is preferred to be in the range of 0.1 to 10 μm.

Various additives such as thermal-polymerizaiton inhibitors, solvents and adhesive promoters may be incorporated into the coloring material-containing photosensitive layer or the photosensitive layer, if desired. The solvents are generally used in a coating solution for each layer.

The thermal-polymerizaiton inhibitors are added for the purpose of increase of shelf stability in the case of using, as the photosensitive ingredient, the polymerizable monomers and photopolymerization initiators. The examples of the thermal-polymerizaiton inhibitors include hydroquinone, p-methoxyphenol, di-t-butyl-p-cresol, pyrogallol, t-butylcatecol, benzoquinone, 4,4'-thiobis(3-methyl-6-t-butylphenol), 2,2'-methylenebis(4-methyl-6-t-butylphenol) and 2-mercaptobenzimidazole.

Examples of the solvents include benzene, toluene, xylene, cyclohexane, ethylene glycol monomethyl ether, ethylene glycol monoethyl ether, propylene glycol monomethyl ether, propylene glycol monoethyl ether, ethylene glycol monomethyl ether acetate, ethylene glycol monoethyl ether acetate, propylene glycol monomethyl ether acetate, propylene glycol monoethyl ether acetate, acetone, methyl ethyl ketone, methyl isobutyl ketone, cyclohexanone, methyl acetate, ethyl acetate, propyl acetate, butyl acetate, methyl lactate, ethyl lactate, methanol, ethanol, 1-propanol, 2-propanol, sec-butyl alcohol, t-butyl alcohol, N-methylpyrrolidone, dimethylformamide, dimethylacetoamide, γ-butyrolactone, ε-caprolactam, dimethyl sulfoxide, hexamehylphosphoric triamide and water. The solvents may be used either alone or as a mixture of two or more of them. It is necessary that solvents used in each of the above-mentioned layers is so adjusted as not to dissolve other layers, particularly a previously coated layer, in order to enable several layers to coat in order.

Examples of coating methods employed for formation of each layer include methods using coating machines such as a spinner, a whirler, a roller coater, a curtain coater, a knife coater, a wire-bar coater and an extruder.

The photosensitive material of the invention can be used in any of known image forming methods and particularly, it is effective to combine the material with a receiving sheet in which an image receiving layer comprising photopolymerizable materials is provided on a support. Examples of the receiving sheet include those described in Japanese Patent Provisional Publications No. 59(1984)-97140, No. 2(1990)-244146 and No. 2(1990)-244147.

Subsequently, a preferred image forming method using the photosensitive material of the invention is explained.

The photosensitive material can be used in known image forming methods (e.g., an image forming method comprising forming an image on a photosensitive material, transferring the image to a receiving sheet and retransferring the image to a permanent support as described in Japanese Patent Provisional Publications No. 63(1988)-2039).

A process for preparation of a color proofing sheet, for example, can be performed utilizing the process of the invention as follows:

Imagewise exposure is conducted using color separation masks and irradiating the photosensitive material containing a corresponding coloring material with a light such as ultraviolet rays. After the imagewise exposure, the material is developed with a developing solution (aqueous alkali solution), washed with water and dried. In this way, a color image is formed on a coloring material-containing photosensitive layer or a laminate of a coloring material layer and a photosensitive layer. This procedure is repeated as often as necessary for preparing differently colored elements to obtain the desired separation images with the desired colors.

Subsequently, the obtained color images are transferred to a receiving sheet having an image receiving layer comprising photopolymerizable materials on a support, in order, and the image formed on the receiving sheet and the image receiving layer are retransferred to a permanent support, and then the retransferred image receiving layer is wholly irradiated with a light to cure.

As examples of the permanent support, there can be mentioned papers such as art paper and coat paper, woodfree paper and groundwood paper, substitutes for paper such as a plastic film containing white pigment, plastic films such as poly(ethylene phthalate) and polycarbonate, a glass, a metal plate and a cloth. Particularly, the papers and the substitutes for paper are generally used for the proof.

A developing solution used for development of a coloring material-containing photosensitive layer or a laminate of a coloring material layer and a photosensitive layer having been subjected to irradiation of a light, is mainly composed of water. Further, it is preferred that alkaline materials or organic solvents miscible with water is incorporated into the developing solution if desired.

Appropriate examples of the alkaline materials include alkaline metal hydroxides such as sodium hydroxide and potassium hydroxide, alkaline metal carbonates such as sodium carbonate and potassium carbonate, alkaline metal bicarbonates such as sodium bicarbonate and potassium bicarbonate, alkaline metal silicates such as sodium silicate and potassium silicate, alkaline metal metasilicates such as sodium metasilicate and potassium metasilicate, ethanol amine, diethanol amine, triethanol amine, morpholine, trialkyl ammonium hydroxide and sodium phosphate.

Appropriate examples of the organic solvents include methanol, ethanol, 1-propanol, 2-propanol, butanol, diacetone alcohol, ethylene glycol monomethyl ether, propylene glycol monoethyl ether, ethylene glycol mono-n-butyl ether, acetone, methyl ethyl ketone, cyclohexanone, ε-caprolactam, γ-butyrolactone, dimethylformamide, dimethylacetoamide and hexamehylphosphoric triamide.

Further, a wetting agent may be incorporated into the developing solution. As the wetting agent, alkylnaphthalene sulfonate which has low foaming property is preferred.

The developing agent can be used as a solution for bath or a solution for spray. Development can be advantageously conducted by known treating methods such as methods of rubbing using a brush or a wetting sponge.

The photosensitive material can be advantageously utilized as a photosensitive transferring material for a conventional image forming method using no receiving sheet. Further, an image formed on the photosensitive material has little color fogging so that the photosensitive material can be advantageously utilized for a method of forming an image directly on the photosensitive material without transferring steps.

Subsequently, the photosensitive material of the invention having a structure (b) is explained. In more detail, the structure (b) comprises a support having a releasing surface, an intermediate layer and a coloring material-containing photosensitive layer or a laminate of a coloring material layer and a photosensitive layer.

The support having a releasing surface is a support wherein at least surface on which the intermediate layer is to be provided has a releasing property. The surface having a releasing surface is one having a releasing layer. Preferred examples of the layer include a layer comprising silicone, fluoro-resin, polyolefin, a copolymer of olefin monomer and at least one of monomers copolymerizable with the olefin monomer such as ethylene/ethyl acrylate copolymer, ethylene/vinyl acetate copolymer or ionomer resin, or a layer containing silicon compound (e.g, a layer of polymer containing silicon compound or fluoro-compound).

Preferred examples of the support having a releasing surface include a poly(ethylene terephthalate) on which a silicone resin-coating layer is provided (e.g., Serapeel available for Toyo Metalizing Co., Ltd.), a support on which a fluoro-resin is coated, a laminate prepared by coextruding a material of a support with polyolefin such as polyethylene or polypropylene, a support on which polyolefin such as polyethylene or polypropylene is laminated, and a support on which a resin having a releasing property (e.g., ethylene/ethylacrylate copolymer, ethylene/vinylacetate copolymer or ionomer resin) is coated.

As the materials of the intermediate layer, the same material as those of the barrier layer of the structure (a) can be used. Further, a silicon compound or fluoro-compound may be incorporated into the intermediate layer.

The coloring material-containing photosensitive layer or the laminate of the coloring material layer and the photosensitive layer are the same as those of the structure (a).

The present invention is further described by the following examples. The term "part" means "weight part" unless otherwise defined.

SYNTHETIC EXAMPLE 1

2.5 parts of poly(sodium acrylate), 1.4 parts of disodium hydrogen phosphate and 0.1 part of sodium dihydrogen phosphate were dissolved in 250 parts of water. While they were stirred at 35° C., 24.0 parts of methyl methacrylate, 58.4 parts of benzyl acrylate and 0.15 part of 2,2'-azobis(2,4-dimethylvaleronitrile) were added dropwise to them to prepare a mixture. The mixture was heated to 75° C. in a stream of nitrogen and stirred for 4 hours. The resultant suspension was filtered, washed with water, and dried to obtain a polymer having a glass transition temperature and a weight-average molecular weight (in terms of polystyrene) which are shown in Table 1.

SYNTHETIC EXAMPLES 2-7

The procedures of Example 1 were repeated except for using polymerizable monomers of each example shown in Table 1 instead of 24.0 parts of methyl methacrylate and 58.4 parts of benzyl acrylate. In this way, polymers which have a glass transition temperature and a weight-means molecular weight (in terms of polystyrene) shown in Table 1, were obtained.

The polymers synthesized in Examples 2 to 4 are those within the scope of the present invention, while the polymers synthesized in Examples 5 to 7 are those outside the scope of the invention.

TABLE 1

| Synthetic Example | Polymerizable Monomer (parts) | Glass Transition Temperature | Weight-average molecular weight |
| --- | --- | --- | --- |
| No. 1 | MMA (24.0) BzA (58.4) | 30° C. | 1,140,000 |
| No. 2 | MMA (33.0) BzA (43.8) | 40° C. | 955,000 |
| No. 3 | BzA (48.6) BzMA (52.9) | 30° C. | 1,040,000 |
| No. 4 | BzMA (63.4) EA (24.0) | 30° C. | 972,000 |
| No. 5 | MMA (60.1) | 105° C. | 782,000 |
| No. 6 | MMA (48.1) BA (15.4) | 50° C. | 531,000 |
| No. 7 | MMA (48.1) BzMA (58.4) | 90° C. | 618,000 |

Note:
MMA: Methyl methacrylate
BzA: Benzyl acrylate
BzMA: Benzyl methacrylate
EA: Ethyl acrylate
BA: Butyl acrylate

EXAMPLE 1

(A) Preparation of Photosensitive Material (1) A coating solution for forming a peel layer having the following composition was prepared.

| Coating solution for peel layer | |
| --- | --- |
| Alcohol-soluble polyamide (DFNS-25, 25 weight % alcohol solution, available from Daicel Co., Ltd.) | 52 parts |
| Styrene/Maleic acid copolymer (Oxylack SH-128, Japan Catalytic Chemical Co., Ltd.) | 7 parts |
| n-propanol | 700 parts |
| Propylene glycol monomethyl ether | 300 parts |

The above coating solution was uniformly coated on a polyethylene terephthalate film having the thickness of 100 μm using a whirler, and the coated layer was dried to form a peel layer having thickness of 0.5 μm.

(2) A coating solution for forming a barrier layer having the following composition was prepared.

| Coating solution for barrier layer | |
| --- | --- |
| A polymer obtained in Synthetic Example 1 | 3.0 parts |
| Methyl ethyl ketone | 80 parts |
| Toluene | 20 parts |

The above coating solution was uniformly coated on the peel layer using a whirler, and the coated layer was dried to form a peel layer having thickness of 0.5 μm. Four supports having a peel layer and a barrier layer were prepared by repeating the above coating procedures four times.

(3) For the purpose of formation of a coloring material-containing layer, a mother liquor (A) the following composition was prepared.

| Mother liquor (A) | |
| --- | --- |
| methacrylic acid/acrylic acid/benzyl methacrylate copolymer (35/15/50; molar ratio) | 40 parts |
| Methyl ethyl ketone | 12 parts |
| Propylene glycol monomethyl ether | 48 parts |

Subsequently as coating solutions for forming yellow (Y), magenta (M), cyan (C) and black (B) light-sensitive resin layers, four kinds of pigment dispersions having the following compositions were prepared.

| Pigment dispersion for yellow coloring containing-material layer | |
| --- | --- |
| Mother liquor (A) | 40 parts |
| Methyl ethyl ketone | 25 parts |
| Ethylene glycol monomethyl ether | 25 parts |
| Lionol yellow NO-1401-G (available from Toyo Ink Mfg Co. Ltd.) | 10 parts |

| Pigment dispersion for magenta coloring containing-material layer | |
| --- | --- |
| Mother liquor (A) | 42 parts |
| Methyl ethyl ketone | 25 parts |
| Isopropyl alcohol | 25 parts |
| Lionol red 6B 4290G (available from Toyo Ink Mfg. Co. Ltd.) | 8 parts |

| Pigment dispersion for cyan coloring containing-material layer | |
| --- | --- |
| Mother liquor (A) | 40 parts |
| Methyl ethyl ketone | 25 parts |
| Ethylene glycol monomethyl ether | 25 parts |
| Cyanin blue NO-700-10FG (available from Toyo Ink Mfg Co. Ltd.) | 10 parts |

| Pigment dispersion for black coloring containing-material layer | |
| --- | --- |
| Mother liquor (A) | 53 parts |
| Methyl ethyl ketone | 20 parts |
| Ethylene glycol monomethyl ether acetate | 20 parts |
| Mitsubishi carbon black MA-100 (available from Mitsubishi Chemical Industries, Ltd.) | 7 parts |

Each dispersion was prepared by dispersing for 3 hours using a dispersion mixture for test (Paint shaker, available from Toyo Seiki Co., Ltd.).

Separately, a thinner for a pigment dispersion having the following compositions was prepared.

| Diluent | |
| --- | --- |
| n-propyl alcohol | 900 parts |
| Acetone | 70 parts |
| Mother liquor (A) | 70 parts |
| Fluorine-type surface active agent (Megafack F-176PF (20 weight % methyl ethyl ketone solution); available from Dainippon Ink & Chemicals Inc.) | 6 parts |

The pigment dispersion of each of the four colors was so diluted with the diluent as to have a weight ratio described below and then subjected to stirring procedure for 10 minutes and dispersing procedure by means of an ultrasonic wave to prepare a coating solutions for the coloring material-containing layer.

The coating solution was filtered through a filter (No. 36 filter, available from Toyo Roshi Co., Ltd.). The resultant solution was coated using a whirl on the barrier layer of the support and dryed at 100° C. for 2 minutes to form a coloring material-containing layer. Four kinds of colorant layers were formed by repeating the above coating procedure four times.

Yellow Layer

Original coating solution for yellow coloring material-containing layer: diluent=160:1040 (parts)
 Dried thickness: 1.0 μm
 Optical density (I.D.): 0.50 (blue filter)

Magenta Layer

Original coating solution for magenta coloring material-containing layer: diluent=140:1160 (parts)
 Dried thickness: 0.7 μm
 Optical density (I.D.): 0.75 (green filter)

Cyan Layer

Original coating solution for cyan coloring material-containing layer: diluent=80:920 (parts)
 Dried thickness: 0.8 μm
 Optical density (I.D.): 0.65 (red filter)

Black Layer

Original coating solution for black coloring material-containing layer: diluent=140:960 (parts)
 Dried thickness: 0.7 μm
 Optical density (I.D.): 0.90 (no filter)

(4) A coating solution for a photosensitive layer having the following composition was prepared.

| Coating solution for light-sensitive resin layer | |
|---|---|
| 1,2-naphthoquinonediazide-4-sulfonic acid -p-t-octylphenyl ester | 1.36 parts |
| Novolac type phenol-formaldehyde resin (PR-50716, available from Sumitomo Dules Co., Ltd.) | 2.86 parts |
| Fluorine-type surface active agent (Megafack F-176PF (20 weight % methyl ethyl ketone solution); available from Dainippon Ink & Chemicals Inc.) | 0.05 parts |
| n-propyl acetate | 57 parts |
| n-butyl acetate | 38 parts |

The coating solution was filtered through a filter (No. 36 filter, available from Toyo Roshi Co., Ltd.). The resultant coating solution was coated using a whirler on each of the coloring material-containing layers (4 colors) and dryed at 100° C. for 2 minutes to form a photosensitive layer having thickness of 0.8 μm. The photosensitive layers were formed on all the four kinds of colorant layers by repeating the above coating procedure four times.

Thus, four kinds (four colors) of photosensitive materials (positive type colored photosensitive materials) comprising a support, a peel layer, a barrier layer, a coloring material-containing layer and a photosensitive layer, superposed in order, were prepared.

(B) Imagewize Exposure and Development

The photosensitive materials each was exposed through a color separating mask (corresponding to each of four colors of photosensitive materials) to a light from a super high-pressure mercury lamp (P-607FW, 1 kW, available from Dainippon Screen Mfg Co., Ltd.) for 60 seconds. Thus, latent images were formed in the photosensitive resin layers.

Using an automatic developing machine (Color Art Processor CA-600P, available from Fuji Photo Film Co., Ltd.), the exposed materials each was automatically developed using the developing solution in which developing solution for Color art CA-1 (available from Fuji Photo Film Co., Ltd.) was diluted five times by the diluent, for 34 minutes at 31° C. to form an image. In such way, color proofing sheets of four colors, in which the color separating masks are accurately copied, were obtained.

Separately, a receiving sheet was prepared. On a diaxially oriented poly(ethylene terephthalate) of 100 μm thick, a coating solution for a first image receiving layer having the following composition and a coating solution for a second image receiving layer having the following composition were coated in order, to form the first image receiving layer of a thickness of 1.0 μm and the second image receiving layer of a thickness of 20 μm, whereby the receiving sheet was prepared.

| Coating solution for formation of a first image receiving layer | |
|---|---|
| Polyethylene chloride (Geon 25, available from Nippon Geon Co., Ltd.) | 10.0 parts |
| Methyl ethyl ketone | 240 parts |
| Cyclohexanon | 60 parts |
| Coating solution for formation of a second image receiving layer | |
| Poly(methyl methacrylate) (mean molecular weight: 100,000, available from Wako Junyaku Co., Ltd.) | 400 parts |
| Pentaerythritol tetraacrylate | 216 parts |
| 2,2-dimethoxy-2-phenylacetophenone | 15 parts |
| p-methoxyphenol | 0.5 part |
| Methyl ethyl ketone | 980 parts |

Subsequently, the color proofing sheet of black color was superposed in perfect registration on the above image-receiving sheet so that the image side came into contact with the second image receiving layer and laminated using Color art transfer machine CA-600T (available from Fuji Photo Film Co., Ltd.). The resultant composite was cooled to room temperature and the poly(ethylene terephthalate) support of the color proofing sheet was peeled away to transfer a black image (i.e., a barrier layer, a coloring material-containing layer and a photosensitive layer) to the image-receiving sheet. As to other three kinds (three colors) of color proofing sheets, their images were transferred in sequence to the same image-receiving sheet in the same manner as the above process, to obtain an image-receiving sheet in which halftone dot-images of four colors were formed.

Subsequently, the image-receiving sheet, in which the four color images were transferred, and art paper (permanent support) were superposed so that the image side came into contact with the art paper to laminate them using the Color art transfer machine and then the support of the image-receiving sheet was peeled away to form the color image to the art paper.

The above-mentioned transferring operations were performed under low temperature and humidity (20° C., 20% RH).

For curing of the second image receiving layer and improvement of color reproduction, the color image on the art paper was wholly exposed (after-exposure) to a light from the above super high-pressure mercury lamp (P-607FW) for 160 seconds to prepare a final image.

(C) Evaluation of Formed Image (1) Transferring Property

It was observed how little bubbles were incorporated in the final image (which was transferred in the condition of low temperature and humidity (20° C., 20%

RH)). The results are set forth in Table 2. In Table 2, "A" means that no bubble is incorporated in the image, and "C" means that some bubbles are incorporated in the image.

(2) Fog in a Portion Having No Image

Density of a portion having no image (consisting of a paper, two receiving layers, a barrier layer and a peel layer) and that of a portion consisting of a paper and an image-receiving sheet, were measured using a visual-filter of a densitometer (Machbeth RD-918, manufactured by Machbeth Co., Ltd.) to calculate the difference. The results are set forth in Table 2 (less value is better).

EXAMPLES 2–4

The procedures of Example 1 were repeated except for using the polymers of Synthetic Examples 2–4 instead of the polymer of Synthetic Example 1 to prepare photosensitive materials of four colors. Using the materials, the formations of image and the evaluations of the final images were performed in the same manner as Example 1. The results are set forth in Table 2.

EXAMPLE 5

The procedure of Example 1 was repeated except for using a poly(ethylene terephthalate) film provided with silicone-coating layer thereon (Serapeel BK, a thickness of 100 μm, available for Toyo Metalizing Co., Ltd.) instead of the support of Example 1 and forming no the peel layer of Example 1, to prepare the photosensitive material of four colors. Using the material, the formation of image and the evaluation of the final image were performed in the same manner as Example 1. The results are set forth in Table 2.

COMPARISON EXAMPLES 1–3

The procedures of Example 1 were repeated except for using the polymers of Synthetic Examples 5–7 instead of the polymer of Synthetic Example 1 to prepare photosensitive materials of four colors. Using the materials, the formations of image and the evaluations of the final images were performed in the same manner as Example 1. The results are set forth in Table 2.

COMPARISON EXAMPLE 4

The procedures of Example 1 was repeated except for using the polymer of Synthetic Example 5 instead of the polymer of Synthetic Example 1 and incorporating 0.9 part of tributyl phosphate in a barrier layer to prepare photosensitive materials of four colors. Using the material, the formation of image and the evaluation of the final images were performed in the same manner as Example 1. The results are set forth in Table 2.

COMPARISON EXAMPLE 5

The procedures of Example 1 was repeated except for using a polycondensation product of terephthalic acid/ethylene glycol/triethylene glycol instead of the polymer of Synthetic Example 1 to prepare photosensitive materials of four colors. Using the material, the formation of image and the evaluation of the final images were performed in the same manner as Example 1. The results are set forth in Table 2.

TABLE 2

|  | Transferring property | Fog |
| --- | --- | --- |
| Example 1 | A | 0.008 |
| Example 2 | A | 0.011 |
| Example 3 | A | 0.010 |
| Example 4 | A | 0.008 |
| Example 5 | A | 0.010 |

TABLE 2-continued

|  | Transferring property | Fog |
| --- | --- | --- |
| Com. Ex. 1 | C | 0.008 |
| Com. Ex. 2 | —*1 | 0.545 |
| Com. Ex. 3 | C | 0.009 |
| Com. Ex. 4 | C*2 | 0.019 |
| Com. Ex. 5 | A | 0.061 |

Note:
*1: A peel layer, a barrier layer and a coloring material-containing layer were mixed one another when a coating solution for the coloring material-containing layer was coated.
*2: Reticulation occurred in a barrier layer when a coating solution for the coloring material-containing layer was coated.

We claim:

1. A photosensitive material comprising a support, a peel layer, a barrier layer and a coloring material-containing photosensitive layer or a laminate of a coloring material layer and a photosensitive layer, superposed in this order:
   wherein said barrier layer comprises a polymer having a glass transition temperature of not higher than 70° C. and which is selected from the group consisting of copolymers of at least 20 molar % of an acrylate monomer having an aromatic ring and no more than 80 molar % of one or two other copolymerizable monomers, and copolymers of at least 20 molar % of a methacrylate monomer having an aromatic ring and no more than 80 molar % of one or two other copolymerizable monomers.

2. The photosensitive material as claimed in claim 1, wherein said peel layer is an alcohol-soluble layer and said barrier layer is an alcohol-insoluble layer.

3. The photosensitive material of claim 1, wherein said polymer has a weight-average molecular weight in the range from 10,000 to 3,000,000.

4. The photosensitive material of claim 1, wherein said the polymer is selected from the group consisting of copolymers of at least 50 molar % of an acrylate monomer having an aromatic ring and no more than 50 molar % of one or two other copolymerizable monomers and copolymers of at least 50 molar % of a methacrylate monomer having an aromatic ring and no more than 50 molar % of one or two other copolymerizable monomers.

5. A photosensitive material comprising (a) a support, (b) an intermediate layer, and (c) a coloring material-containing photosensitive layer or a laminate of a coloring material layer and a photosensitive layer, layers (a), (b) and (c) being superposed in this order;
   wherein a surface of the said support on which said intermediate layer is provided has a releasing property and said intermediate layer comprises a polymer having a glass transition temperature not higher than 70° C. and which is selected from the group consisting of copolymers of at least 20 molar % of an acrylate monomer having an aromatic ring and no more than 80 molar % of one or two other copolymerizable monomers, and copolymers of at least 20 molar % of a methacrylate monomer having an aromatic ring and no more than 80 molar % of one or two other copolymerizable monomers.

6. The photosensitive material of claim 5 wherein said polymer has a weight-average molecular weight in the range of 10,000 to 3,000,000.

7. The photosensitive material of claim 5, wherein said the polymer is selected from the group consisting of copolymers of at least 50 molar % of an acrylate monomer having an aromatic ring and no more than 50 molar % of one or two other copolymerizable monomers and copolymers of at least 50 molar % of a methacrylate monomer having an aromatic ring and no more than 50 molar % of one or two other copolymerizable monomers.

* * * * *